United States Patent [19]

Aschwanden

[11] 4,097,810
[45] Jun. 27, 1978

[54] PHASE LOCKED LOOP TUNING SYSTEM WITH A PRESET CHANNEL MEMORY

[75] Inventor: Felix Aschwanden, Thalwil, Switzerland

[73] Assignee: RCA Corporation, New York, N.Y.

[21] Appl. No.: 790,863

[22] Filed: Apr. 26, 1977

[30] Foreign Application Priority Data

Oct. 27, 1976 United Kingdom ............... 44661/76

[51] Int. Cl.² .............................................. H04B 1/16
[52] U.S. Cl. .................................. 325/453; 325/455; 325/464; 325/468
[58] Field of Search ............... 325/453, 455, 459, 464, 325/465, 468, 419; 358/191; 331/1 A, 17, 18, 25

[56] References Cited

U.S. PATENT DOCUMENTS 3,514,713  5/1970  Leyde ...................................... 331/17
3,681,706  8/1972  Harzer ..................................... 331/17
4,024,476  5/1977  Briggs ..................................... 325/459

Primary Examiner—Benedict V. Safourek
Assistant Examiner—Marc E. Bookbinder
Attorney, Agent, or Firm—Eugene M. Whitacre; Paul J. Rasmussen; Peter M. Emanuel

[57] ABSTRACT

A divide-by-N programmable counter arrangement of a phase locked loop tuning system is programmed by selectively coupling one of a group of preset tuning potentiometers corresponding to respective tuning positions to a monostable multivibrator. The monostable multivibrator determines the duration of a counting interval and thereby controls the frequency of a local oscillator signal generated by the phase locked loop tuning system. The count accumulated during the counting interval is stored and displayed during another interval to indicate the selected tuning position.

10 Claims, 5 Drawing Figures

PHASE LOCKED LOOP TUNING SYSTEM WITH A PRESET CHANNEL MEMORY

Background of the Invention

The present invention relates to the field of phase locked loop tuning systems.

Electronic tuning systems, employing active tuning elements such as voltage controllable varactor diodes to determine the frequencies of local oscillator signals appropriate for tuning respective information bearing carriers are starting to replace more conventional mechanical tuning systems employing passive tuning elements in radio and television receivers because of their inherent reliability and versatility.

However, electronic tuning systems, unlike their mechanical counterparts, typically require apparatus for maintaining tuning information, e.g., tuning control voltages, during the absence of power to avoid the necessity of retuning when power is returned. In addition, while there may be many carriers assigned to a specified frequency range, e.g., the FM radio broadcast range, because of reasons such as relative signal strengths and program content, some tuning positions may be preferred to others. Therefore, it is desirable that an electronic tuning system include provisions for preselecting a group of preferred tuning positions. Furthermore, as with their mechanical tuning counterparts, electronic tuning systems should include apparatus for indicating selected tuning positions. This becomes a more difficult task when different preferred tuning positions, depending on the reception locality, may be preselected by a user. This is so because unlike the case where a receiver provides tuning positions for every assigned information bearing carrier, neither the tuning information for the preferred tuning positions or the corresponding display information is known before the receiver reaches its destination.

Among the various types of electronic tuning systems which have been suggested, ones including a phase locked loop (PLL) for synthesizing local oscillator signals of appropriate frequencies from a reference frequency signal derived from a crystal oscillator have been found to be particularly advantageous because their accuracy and stability is primarily a function of the crystal oscillator which may be made highly accurate and stable. In these PLL tuning systems, the control voltage of a voltage controlled local oscillator is derived in such a manner as to minimize the phase and frequency differences between the reference frequency signal and a signal derived by dividing the frequency of the local oscillator signal by a factor N. A tuning position is selected by controlling the factor N.

Programmable counters which have been conventionally employed in PLL tuning systems to control the factor N are programmed in response to binary words typically including 8 to 10 binary digits (bits). Apparatus such as thumbwheel switches, mechanical programming cards, magnetic and semiconductor volatile memories used in conjunction with standby power sources and nonvolatile semiconductor memories have been utilized in PLL tuning systems in order to control the content of binary words to program divide-by-N counters and preselect preferred tuning positions, store the binary words during the absence of power and provide a source of binary information for display to indicate selected tuning positions. Unfortunately, these "memory" systems are relatively complex and expensive.

Electronic tuning systems are known which utilize a group of potentiometers to develop DC tuning voltages corresponding to various tuning positions to directly control the frequency of a voltage controlled oscillator. Such a tuning system is disclosed, for example, in U.S. Pat. No. 3,755,763 issued in the name of Hoshi. The potentiometers in these tuning systems serve to retain tuning information during the absence of power and also allow the selection of particular preferred tuning positions. However, because conventional programmable counters employed in PLL tuning systems are programmed in response to binary signals rather than DC voltages, the potentiometer type of tuning control has not been employed in PLL tuning systems. While a frequency divider for a phase locked loop frequency identification system which is controlled in response to an analog control signal is disclosed in U.S. Pat. No. 3,983,497 issued to Hegeler, it is not arranged so that tuning positions may be preset and stored during the absence of power or to display information indicating selected tuning positions.

In potentiometer tuning systems, such as the Hoshi system referred to above, scales may be used with the potentiometers to provide an approximate indication of tuning positions. However, because of the relatively close frequency spacing between information bearing carriers, it may be extremely difficult for a user to distinguish between closely distributed tuning positions.

A variety of more precise tuning position display arrangements which in essence count the number of cycles of a signal which may be related to a local oscillator signal during a fixed time interval are known. For example, see U.S. Pat. Nos. 3,835,424 - Marik; 3,851,254 - Merrell, et al. and 3,991,382 - Iida, et al. However, the tuning systems in which they are employed lack the desirable features of a phase locked loop tuning system which may be programmed or preset in a relatively simple and inexpensive manner such as by means of potentiometers.

SUMMARY OF THE PRESENT INVENTION

A programmable divider of a phase locked loop tuning system for dividing the frequency of a local oscillator signal includes first counting means for counting a programmed number M of input signal cycles during the duration of a programming signal and second counting means for counting a fixed number K of input signal cycles to develop an output signal having a frequency inversely related to the frequency of the local oscillator by a number $N = K + M$. The count $M$ is stored by the first counting means while the second counting means is counting so that it may be decoded and displayed to indicate a selected tuning position. A tuning position is selected by coupling one of a plurality of passive timing elements such as presettable tuning potentiometers corresponding to respective tuning positions to monostable multivibrator means for controlling the duration of the programming signal.

DETAILED DESCRIPTION OF THE PREFERRED EMBODIMENT OF THE PRESENT INVENTION

Although the present invention will be explained with reference to a tuning system for tuning European FM radio broadcast carriers, it will be understood that the present invention may be readily modified for tuning other information bearing carriers such as those associated with television reception.

Figure 1:
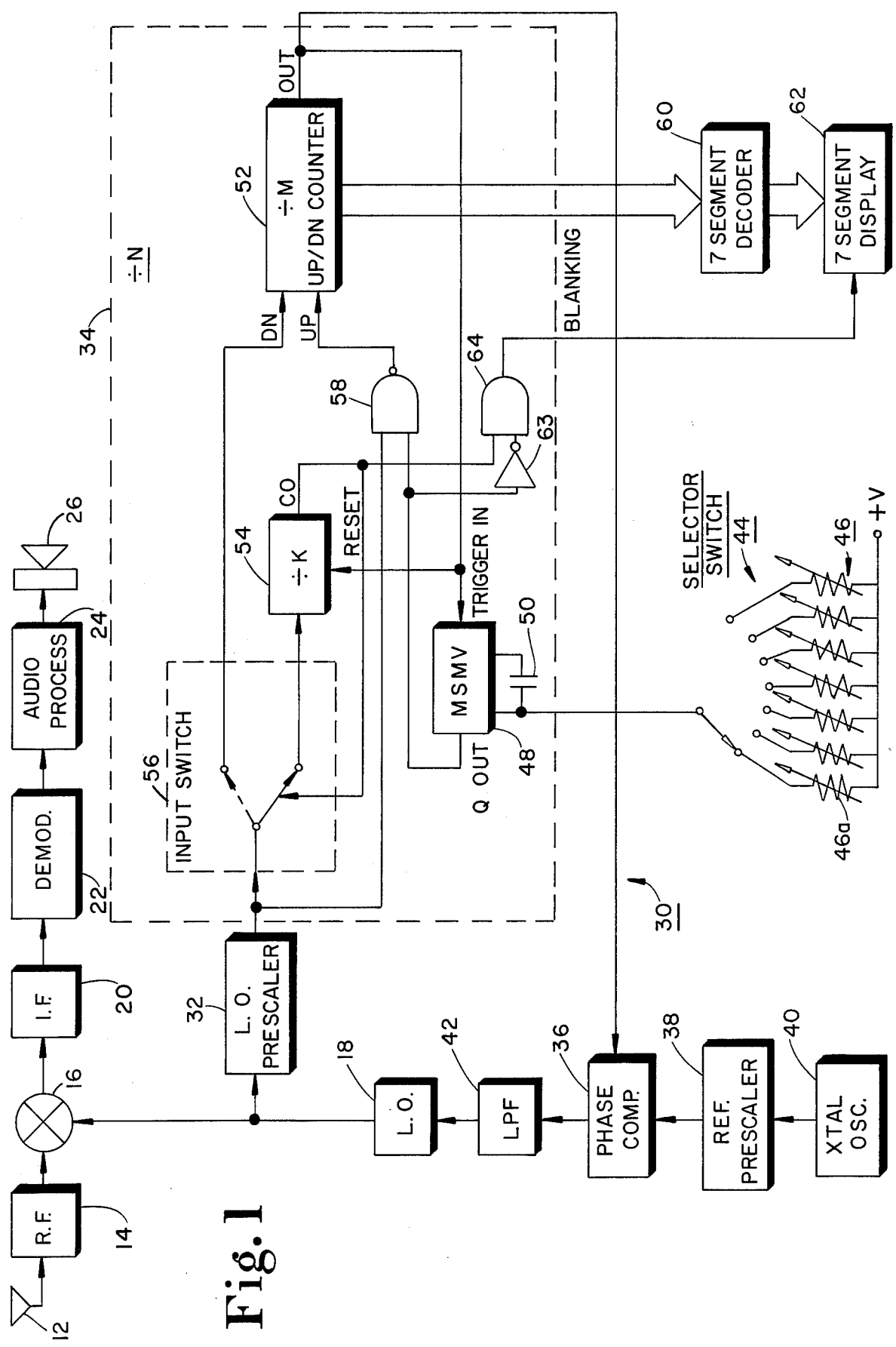
FIG. 1 shows partially in block diagram form and partially in logic diagram form a preferred embodiment of the present invention.

In Europe the FM broadcast carriers are spaced 100 KHz apart in a frequency band between 87.3 and 104.5 MHz. Thus, 172 (i.e., (104.5 – 87.3/0.1)stations or channels are available. In the FM radio receiver of FIG. 1, broadcast carriers are received by an antenna 12, amplified and otherwise processed by an RF input section 14 and coupled to a mixer 16. A local oscillator 18 is controlled to selectively provide 1 of 172 local oscillator signals spaced 100 KHz in a frequency range between 98 and 115.2 MHz which are combined with the respective broadcast carrier by mixer 16 to provide an IF signal having a 10.7 MHz carrier. The IF signal is amplified and otherwise processed by an IF section 20, demodulated by demodulator 22 and processed by audio processing section 24 to provide an audio response by means of speaker 26.

Local oscillator 18 is included in a phase locked loop (PLL) tuning system 30 which provides a control signal to control its frequency of oscillation. In addition to being coupled to mixer 16, the local oscillator signal is coupled to a local oscillator prescaler 32, comprising, for example, a high speed ECL (emitter-coupled logic) counter, to divide the relatively high frequency of the local oscillator signal by a fixed number, for example 8, so that it may be further divided by a relatively slower speed divide-by-N programmable divider 34 which follows prescaler 32. Divide-by-N programmable divider 34 is programmed to divide the frequency of the output signal of prescaler 32 by a programmed integer number corresponding to a particular selected station.

The output signal of programmable divide-by-N divider 34 is coupled to a phase comparator 36 together with a reference frequency signal generated by a reference prescaler 38 by dividing the frequency of the output signal of a crystal oscillator 40 by a fixed number, for example 8. Phase comparator 36 develops an error signal representing the phase and frequency deviations between the output signals of divide-by-N divider 34 and reference frequency prescaler 38. The error signal is filtered by a low pass filter 42 to derive the control signal for local oscillator 18.

The frequency of local oscillator 18 is controlled in response to the control signal unit the phase and frequency of two input signals of phase comparator 36 are substantially equal. At this point PLL tuning system 30 is said to be locked and the local oscillator frequency $f_{LO}$, is equal to $Nf_{XTAL}$, where $f_{XTAL}$ is the frequency of the crystal oscillator. Thus assuming $f_{XTAL}$ is selected to be equal to 100 KHz, the appropriate local oscillator frequency, $f_{LO}$, between 98 and 115.2 MHz for receiving a particular FM carrier may be selectively provided by PLL tuning system 30 by programming N to equal the respective integer number between 980 and 1152 defined by ($f_{LO}$/100 KHz).

In the present tuning system, divide-by-N divider 34 is programmed to tune a particular station when a user positions a selector switch 44 to couple a supply voltage +V through a respective one of a group of potentiometers 46 corresponding to the various stations or tuning positions to a monostable multivibrator (MSMV) 48. If, as shown, the station corresponding to a potentiometer 46a has been selected, the duration of programming pulses generated by MSMV 48 are determined by a timing network comprising potentiometer 46a and a capacitor 50 which is also coupled to monostable multivibrator 48. In essence, during each cycle of the divide-by-N output signal, during the duration of a corresponding programming pulse, a programmed number of cycles, M, of the output signal of LO prescaler 32 counter are counted by an up-down counter 52. In addition, during each cycle of the divide-by-N output signal a fixed number of cycles, K, of the output signal of LO prescaler 32 are counted by a fixed modulus counter 54. Up-down counter 52 and fixed divider 54 are arranged so that the divide-by-N output signal has a period equal to $N = K + M$ cycles of the output signal of LO prescaler 32.

Figure 2:
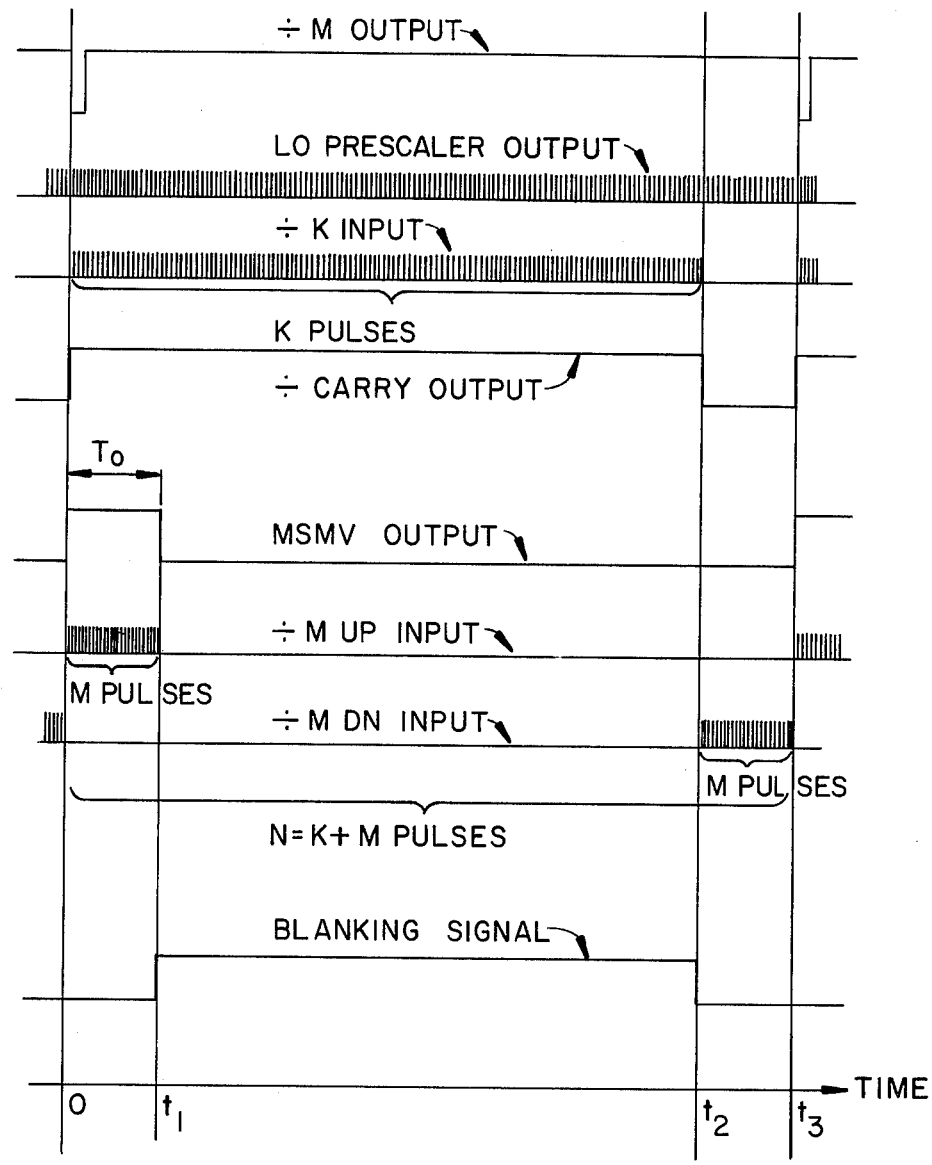
FIGS. 2-5 are graphic representations of signal relationships which facilitate an understanding of the present invention.

To understand the detailed operation of the divide-by-N divider 34, reference should now be made to FIG. 2 which shows graphical representations of various waveforms associated with the present implementation of divide-by-N divider 34. At a point in time (0 in FIG. 2) at which a divide-by-N output cycle has just been completed, a negative-going pulse is generated at the zero count output (OUT) of up-down counter 52 and coupled to the RESET input of divide-by-K counter 54 and the TRIGGER input of monostable multivibrator 48. In response, divide-by-K counter 54 is reset to a count of zero and monostable multivibrator 48 is triggered. At this point in time, divide-by-N, an electronically controllable input switch 56 (shown symbollically) couples the output signal of LO prescaler 32 to the input of divide-by-K counter 54 and it beings to count up to the fixed number K. Simultaneously, and NAND (Negative AND) gate 58 is enabled to couple the output of LO prescaler 32 to the UP count input of up-down counter 52 in response to the programming output pulse of MSMV 48 and counter 52 begins to count up. The output signal of LO prescaler output 32 continues to be coupled to the UP input of counter 52 by NAND gate 58 until the termination of the programming output pulse of MSMV 48 at a time $t_1$. At this point, up-down counter 52 has counted M cycles of the output signal of LO prescaler 32, determined by the duration $T_0$, of the programming pulse. Thereafter, the programmed number M is stored in counter 52 while counter 54 continues to count. When, at a time $t_2$, K cycles of the output signal of LO prescaler 32 have been counted by counter 54, counter 54 generates a carry-out (CO) signal. The CO signal is coupled to input switch 56 which in response couples the output signal of LO prescaler 32 to the DN input of up-down counter 52 instead of to the input of divide-by-K counter 56. Up-down counter 52 now counts down from M. When the count in counter 52 reaches zero, at a time $t_3$, a negative-going pulse is again generated at its zero count output (OUT) and a new divide-by-N cycle begins.

In summary then, first a fixed number K of cycles of the output signal of LO prescaler 32 are counted by counter 54 and then a programmed number M, depending on the duration of the programming pulse generated by MSMV 48, cycles of the output signal of LO prescaler 32 are counted by counter 52 to make a total of K + M cycles of the output signal of LO prescaler 32 counted during a divide-by-N cycle. By way of example, if the fixed number K is chosen as 907 and M is controlled to be an integer number between 73 and 245, it will be seen that all of the respective local oscillator frequencies between 98 MHz and 115.2 MHz in 100 KHz steps are obtainable from PLL tuning system. In addition, divide-by-N divider 34 is arranged to provide a substantially continuous display to indicate the particular tuning position selected. Specifically, because up-down counter 52 is enabled to count up during the same interval, i.e., between 0 and $t_1$, in which counter 54 is counting and is disabled from counting before counter 54 reaches a count of K, there is a relatively long interval, i.e., between $t_1$ and $t_2$, in which the contents of up-down counter 52 may be stored, decoded by a seven segment display decoder and displayed by means of a seven segment display system 62. Moreover, during the intervals in which the contents of up-down counter 52 are being counted up and down, i.e., between 0 and $t_1$ and $t_2$ and $t_3$, a blanking signal (a low logic level) to inhibit flickering of display 62 is generated in response to the programming output signal of MSMV 48 and carry-out signal of divide-by-K divider 54 by an inverter 63 and an AND gate 64. By utilizing any one of a number of well-known decoding arrangements, the display may be scaled in frequency or alternately in channel number for television applications.

Figure 3:
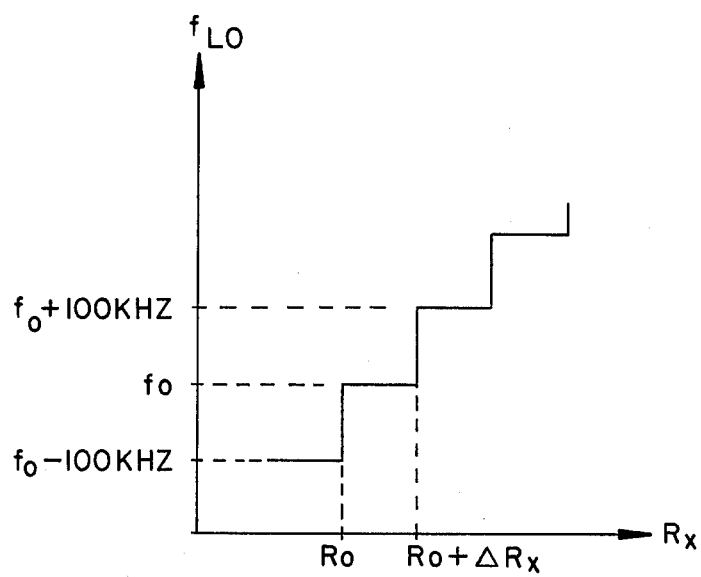
Figure 4:
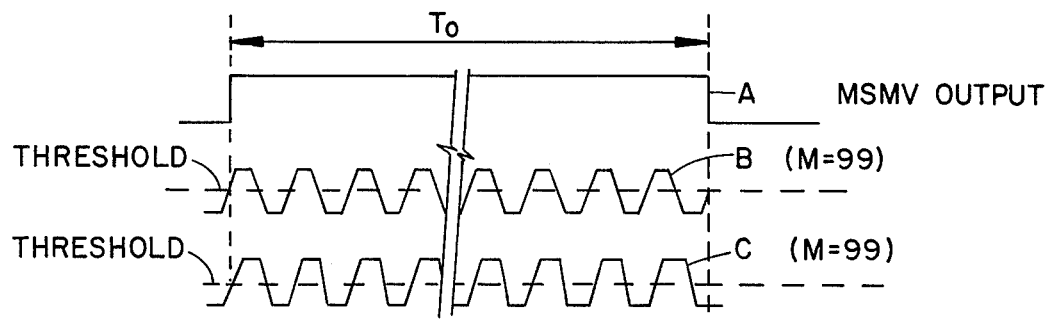
Figure 5:
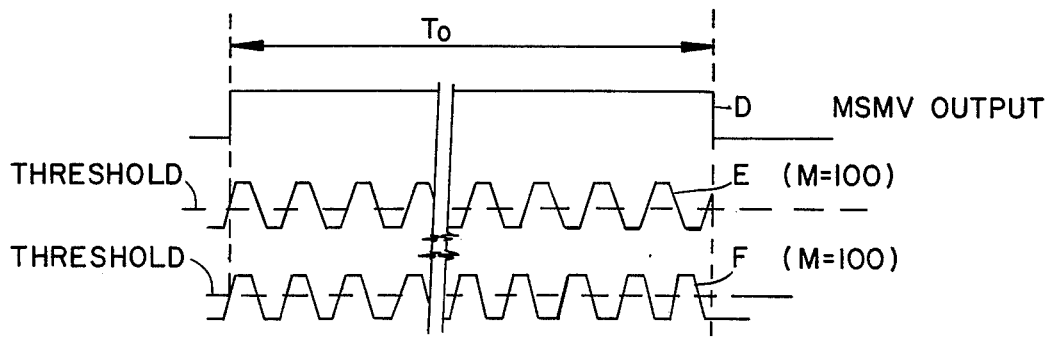

Each of the potentiometers 46 may be adjusted to preselect a particular tuning position or station. While each of the potentiometers are continuously variable, the frequencies of the local oscillator signal are programmable in 100 KHz steps. This is graphically demonstrated by the staircase shape of the characteristic of local oscillator frequency, $f_{LO}$, versus resistance value, $R_x$, shown in FIG. 3. As indicated in FIG. 3, between, but not including, the end points a range of resistance values only one local oscillator frequency can be obtained. This situation corresponds to the occurrence of the termination of the programming pulse between the leading edges of two adjacent output pulses or cycles of the LO prescaler signal. For example, between, but not including, the values $R_o$ and $R_o + \Delta R_x$ only $f_o$ is obtained. However, at the end points of a range of resistance values ambiguous tuning situations may occur. For example, at $R_o$ the frequency may be $f_o$ or $f_o - 100$ KHz and at $R_o + \Delta R_x$ the frequency may be $f_o$ or $f_o + 100$ KHz. The ambiguity arises when the termination of programming pulses is substantially coincidental with the leading edge of one of the output pulses of LO prescaler 32. This can be more clearly understood by reference to FIGS. 4 and 5. If the termination of the programming pulse occurs when the amplitude of the last up-count pulse of the LO prescaler 32 is still lower than the threshold of up-down counter 52 (see waveforms A and B), there will be a count accumulated in up-down counter 52 (e.g., 99) which is one less than the count accumulated (e.g., 100) if the termination of the programming pulse occurred when the amplitude of the last up count pulse was already higher than the threshold of up-down counter 52 (see waveforms D and E).

In the present tuning system, the PLL operation automatically minimizes the possibility of an ambiguity. For example, while an initial adjustment of a potentiometer may be such that the termination of the programming pulse occurs when the last up count pulse has an amplitude just barely above threshold of up-down counter 52 (see waveforms D and E), the frequency of the local oscillator signal will be caused to increase in response to the control signal generated by low pass filter 42 so that subsequent last up count pulses will have adequate amplitudes (see waveforms D and F) to ensure stable operation. Similarly, if an initial adjustment of a potentiometer is such that the termination of the programming pulse occurs when the pulse has an amplitude just below the threshold of up-down counter 52 (see waveforms A and B), the frequency of the local oscillator signal will be caused to decrease so that stable operation without partial last up count pulses near the threshold results (see waveforms A and C).

Since changes in the duration of the programming pulse can cause only step changes in frequency, the accuracy of the present PLL tuning system is primarily a function of the accuracy of crystal oscillator 40. However, to ensure that the local oscillator frequency does not jump from one tuning position to another, the tolerance, in terms of time, of the duration of the programming pulses must be less than the shortest time interval between the output pulses of LO prescaler 32. Assuming that the output signal of LO prescaler 32 has a 50 percent duty cycle, the tolerance on the duration of a programming pulse is defined by the expression $$(T)(M)(P) < 0.5 P \qquad (1)$$

where T is the tolerance on the duration of the programming pulse output of MSMV 48;

M is the number LO prescaler output cycles counted during the duration of a programming pulse; and P is the period of the output signal of LO prescaler 32. Expression (1) can be simplified and rewritten as $T < (1/2 \ 1/M)$. In the preferred embodiment described above, M varies from 73 to 245. Therefore, the smallest tolerance on the duration of the programming pulse is $(1/(2)(245))$ or approximately ±0.2%. Four elements affect the tolerance on the duration of the programming pulse: MSMV 48, potentiometers 46, capacitor 50, supply voltage +V of MSMV 48 and the operating temperature. By utilizing a Texas Instruments model number SN74121 TTL (transistor-transistor logic) integrated circuit monostable multivibrator, the effect of supply voltage variation is made negligible. The SN74121 integrated circuit has a +80 ppm (parts per million) temperature coefficient which can be compensated by a negative temperature coefficient capacitor such as an Erie model number Red Caps 8111 type capacitor having a temperature coefficient of −80±30ppm. Multivibrator potentiometers such as a Spectrol model number 47 multiturn potentiometer having temperature coefficients of ± 50 ppm may be used to complete the arrangement. With these suggested components, the tolerance of the duration of the programming pulse over a temperature range between 0° and 40° C will be approximately between −0.16 and +0.16 percent, well within the desired 0.2 percent tolerance.

What is claimed is:

1. An apparatus for tuning a receiver to receive any one of a plurality of radio frequency carriers, comprising:

a plurality of passive timing means corresponding to respective radio frequency carriers;

monostable multivibrator means for generating a programming signal;

program selection means for selectively coupling one of said plurality of passive timing means to said monostable multivibrator means to determine the duration of said programming signal;

local oscillator means for generating a local oscillator signal having a frequency determined in response to a control signal;

first counter means for counting to a fixed number K in response to a signal coupled to it;

second counter means for counting to a programmed number M of signal cycles determined in response to the duration of said programming signal in response to a signal coupled to it;

input switch means for selectively coupling said local oscillator signal to said first and second counter means in accordance with the number of cycles accumulated by said first and second counter means, one of said first and second counter means developing an output signal having a period directly related to the period of said local oscillator signal by a factor $N = K + M$, said input switch means enabling storage of said programmed number M in said second counter means development during said output signal; and phase comparator means for generating an error signal representing the phase and frequency deviations between a reference frequency signal and said output signal and developing therefrom said control signal for said local oscillator means.

2. The apparatus recited in claim 1 further including display means coupled to said second counter means to display information related to said programmed number M stored in said second counter; and blanking means coupled to said display means to disable said display means when said local oscillator signal is coupled to said second counter means.

3. The apparatus recited in claim 2 wherein said second counter means is an up-down counter having up count and down count inputs; said fixed number K is greater than said programmed number M; and said input switching means couples said local oscillator signal simultaneously to said first counter means and to said up count input of said up-down counter until said first counter has counted a number of signal cycles equal to said fixed number K and then couples said local oscillator signal to said down count input of said up-down counter until said up-down counter has counted down from said programmed number M to zero and then again couples said local oscillator signal to said first counter means and said up count input of said up-down counter.

4. The apparatus recited in claim 3 wherein said up-down counter generates said output signal when a count of zero is reached.

5. The apparatus recited in claim 4 wherein said first counter means is reset, said programming signal is initiated and said up-down counter is enabled to count up in response to the generation of said output signal.

6. The apparatus recited in claim 3 wherein said display means is unblanked between the time said programming signal terminates and the time when said first counter means counts said fixed number K of signal cycles.

7. The apparatus recited in claim 1 wherein said local oscillator signal is coupled to said switch means through frequency division means for generating a pulse train signal having a frequency less than the frequency of said local oscillator signal, and the duration of said programming signal has a tolerance associated therewith which is less than the shortest time interval between pulses of said pulse train signal.

8. The apparatus recited in claim 1 wherein said passive timing means are resistive.

9. The apparatus recited in claim 8 wherein said passive timing means include variable resistance elements.

10. The apparatus recited in claim 1 wherein the number of passive timing means is less than the total number of radio frequency carriers allocated to the frequency reception range of said receiver.

* * * * *

UNITED STATES PATENT OFFICE
CERTIFICATE OF CORRECTION

PATENT NO. : 4,097,810

DATED : June 27, 1978

INVENTOR(S) : Felix Aschwanden

It is certified that error appears in the above-identified patent and that said Letters Patent are hereby corrected as shown below:

Column 3, line 53, that portion reading "unit" should read
-- until --; Column 4, line 36, that portion reading "and"
should read -- an --; Column 7, lines 19 and 20, that
portion reading "means development during said output
signal" should read -- means during said output signal
development --.

Signed and Sealed this

Seventh Day of November 1978

[SEAL]

Attest:

RUTH C. MASON
Attesting Officer

DONALD W. BANNER
Commissioner of Patents and Trademarks